United States Patent [19]

Beydler et al.

[11] 4,147,940
[45] Apr. 3, 1979

[54] MOS INTERFACE CIRCUIT

[75] Inventors: William W. Beydler, Laurel; Arden R. Helland, Pasadena, both of Md.

[73] Assignee: Westinghouse Electric Corp., Pittsburgh, Pa.

[21] Appl. No.: 761,822

[22] Filed: Jan. 24, 1977

[51] Int. Cl.² .................... H03K 19/08; H03K 17/04
[52] U.S. Cl. .................... 307/205; 307/208; 307/270; 307/362; 307/DIG. 1
[58] Field of Search ............ 307/208, 264, 270, 362, 307/363, 205, DIG. 1; 330/252

[56] References Cited

U.S. PATENT DOCUMENTS

| | | | |
|---|---|---|---|
| 3,431,505 | 3/1969 | D'Agostino | 330/252 |
| 3,591,855 | 7/1971 | Dean et al. | 307/DIG. 1 X |
| 3,675,043 | 7/1972 | Bell | 307/DIG. 1 X |
| 4,000,411 | 12/1976 | Sano et al. | 307/DIG. 1 X |
| 4,002,928 | 1/1977 | Goser et al. | 307/DIG. 1 X |

FOREIGN PATENT DOCUMENTS 2250554  4/1974  Fed. Rep. of Germany .... 307/DIG. 1

OTHER PUBLICATIONS

Millman et al, *Electronic Devices and Circuits*, pp. 203–204, 400, 402–403; McGraw-Hill Book Co.; 1967.
Kalter, "Bipolar and FET Integration on a Common Chip"; IBM Tech. Discl Bull.; vol. 15, No. 12, pp. 3755–3756; 5/1973.

*Primary Examiner*—Larry N. Anagnos
*Attorney, Agent, or Firm*—H. W. Patterson

[57] ABSTRACT

A circuit utilizing a source follower and a comparator to interface an MOS digital circuit with bipolar digital circuits is disclosed.

1 Claim, 2 Drawing Figures

MOS INTERFACE CIRCUIT

STATEMENT OF GOVERNMENT INTEREST

This invention was either disclosed or first reduced to practice under a Contract No. F 19628-70-C-0218 with the Department of the Air Force.

BACKGROUND OF THE INVENTION

1. Field of the Invention

The invention relates to electronic circuits and more particularly to an interface circuit and a method for improving the speed of the circuit interfacing an MOS digital system with a digital system having different signal requirements.

2. Description of the Prior Art

Prior art digital systems can be roughly divided into system utilizing MOS transistors and those utilizing bipolar transistors. The MOS system typically generates digital signals with the difference between a logic "0" and a logic "1" level being several volts. By contrast, the difference in the logic levels of digital systems utilizing bipolar transistors may be as low as a few millivolts. In order to use both MOS and bipolar circuits in the same system, it becomes necessary to provide some means for converting the logic signals generated by MOS digital circuits to those generated by bipolar digital circuits. Typical prior art techniques for converting the logic level generated by MOS digital circuits to those acceptable by bipolar digital circuits was to utilize a grounded source MOS amplifier to supply a voltage signal to one input of a differential comparator. The other input to the comparator was a stable reference voltage. The output of the comparator would be a two level signal compatible with bipolar circuits with the level being determined by whether or not the output signal from the MOS digital circuit exceeded the reference voltage. This technique resulted in a relatively slow circuit due to the inherent frequency limitations of grounded source MOS output transistor.

SUMMARY OF THE INVENTION

The subject of this inventon is an interface circuit and method of operating the output transistor of typical prior art MOS systems such that the usual common source output stage is changed to a source follower. This substantially improves the operating speed of the combined system because the source follower configuration for the MOS circuit is inherently faster than the prior art grounded source configuration.

This change in mode of operation is accomplished by changing the polarity of the voltage coupled to the load resistor utilized by the output transistor of the MOS system and the polarity of the reference voltage to the comparator utilized to detect whether the output signal of the MOS system is above or below the reference voltage. This change in the circuit configuration changes the mode of operation of the MOS output stage from a common source to a source follower.

DETAILED DESCRIPTION

Figure 1:
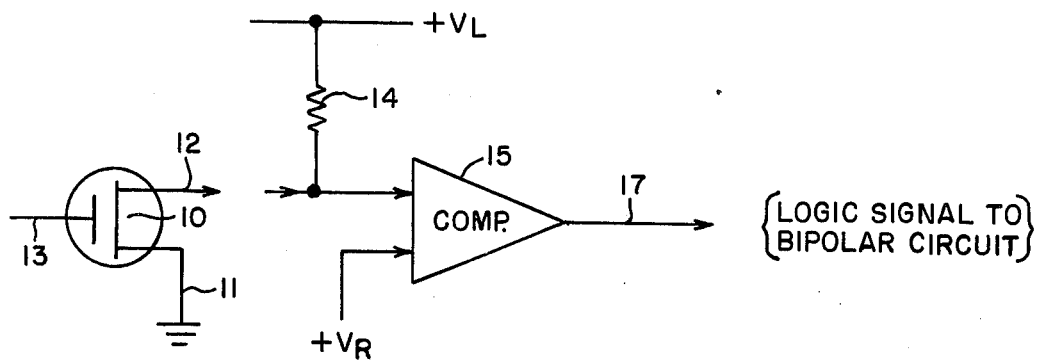
FIG. 1 is a diagram of a typical prior art interface circuit.

FIG. 1 is a schematic diagram of the prior art interface circuit utilized to convert the output signal from an MOS digital system to logic levels compatible with the requirements of bipolar digital circuits. The circuit includes an MOS transistor 10 which has its source terminal 11 coupled to the MOS system ground terminal. The voltage at the drain terminal 12 of the MOS transistor 10 is the signal of the system. The logic signal generated by the associated MOS system is coupled to the gate 13 of the MOS transistor 10.

The drain terminal 12 of the MOS transistor 10 is coupled to a plus voltage source $V_L$ through a load resistor 14. The junction formed by the drain terminal 12 of transistor 10 and the load resistor 14 is coupled to one input of a comparator 15. The second input terminal of comparator 15 is coupled to a plus reference voltage $V_R$. This causes the signal at the output terminal 17 of the comparator 15 to switch between first and second voltage levels which are compatible with the signal requirements of bipolar circuits. This signal has its first level when the MOS transistor is on causing the voltage coupled to the first terminal of comparator 15 to be lower than the reference voltage $V_R$ and a second level when this transistor is off causing the voltage to the first terminal of the comparator to be greater than the reference voltage $V_R$. These two voltages are selected to be compatible with the signal requirements of the system to which the MOS system is to be interfaced.

Figure 2:
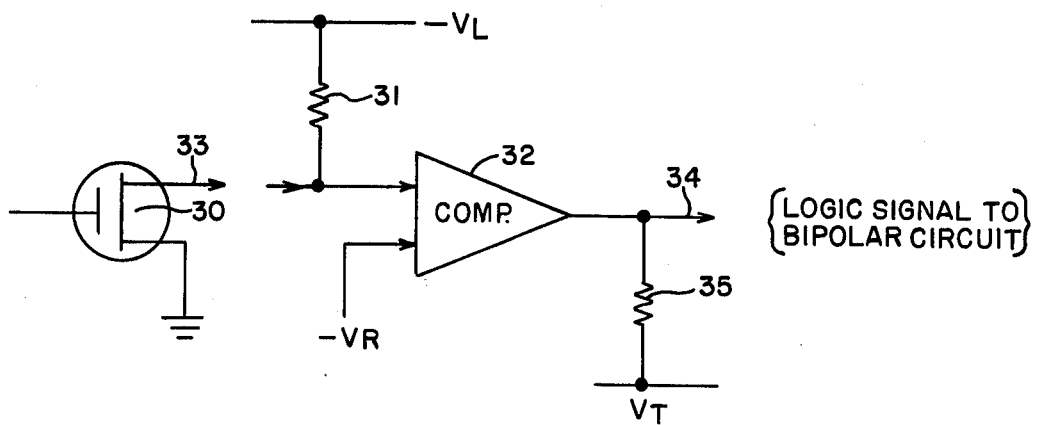
FIG. 2 is a schematic diagram of the improved interface circuit which is the subject of this invention.

FIG. 2 is a schematic diagram of the improved interface circuit. The improved circuit includes an MOS transistor 30 which is a part of the MOS system. A load resistor 31 is coupled between a minus reference voltage $V_L$ and one input terminal of a voltge comparator 32. This terminal of the voltage comparator is coupled to terminal 33 of the MOS transistor 30. The minus reference voltage causes the terminal 33 of MOS transistor 30 which was previously the drain, to function as the source. Thus, a change in the polarity of the voltage coupled to the load resistor 31 has changed the mode of operation of the MOS transistor 30 from a common source to a source follower configuration.

The second input terminal of comparator 32 is coupled to a minus voltage reference $V_R$. A digital signal is generated at the output terminal 34 of comparator 32 which has two states compatible with the signal requirements of the bipolar system to which the MOS system is to be coupled. These two states are determined by whether or not the voltage output from the MOS system is greater or less than the minus reference voltage $V_R$ coupled to the other input terminal of the comparator 32. An output resistor 35 is also coupled between the output terminal 34 and a voltage $V_T$. This resistor can have a relatively low value in the range of 100 ohms thereby further improving the speed of operation of the comparator by loading the output of the compartor 32.

Suitable comparators are commercially available for use in either the circuits illustrated in FIG. 1 or 2 to interface typical MOS systems with either TTL or ECL circuits. It is well within the skill of those in the art to design comparators having other non-standard characteristics.

We claim:

1. An improved method of interfacing an MOS logic circuit utilizing an MOS output stage with a logic circuit having different signal requirements, the improvement comprising; coupling the output terminal of said MOS logic circuit to a first negative potential voltage source through a resistor with the polarity of said voltage source being selected and coupled across the MOS logic circuit such that said output stage operates as a source follower, coupling the output terminal of said MOS logic circuit to a first input terminal of a comparator, and coupling a second input terminal of said comparator to a reference voltage said reference voltage having a second negative potential and being of a magnitude between ground and said first negative potential to generate at an output terminal of said comparator a first signal compatible with the logic circuit with which said MOS logic circuit is to be interfaced, in response to a second signal on the output of said MOS logic circuit, said second signal having a first state having substantially a ground potential and a second state having a potential between said first and second negative potentials.

* * * * *